US011302481B2

(12) United States Patent
Cho et al.

(10) Patent No.: US 11,302,481 B2
(45) Date of Patent: Apr. 12, 2022

(54) ELECTRONIC COMPONENT AND SUBSTRATE HAVING THE SAME MOUNTED THEREON

(71) Applicant: SAMSUNG ELECTRO-MECHANICS CO., LTD., Suwon-si (KR)

(72) Inventors: Beom Joon Cho, Suwon-si (KR); Jae Young Na, Suwon-si (KR); Ki Young Kim, Suwon-si (KR); Ji Hong Jo, Suwon-si (KR); Woo Chul Shin, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 10 days.

(21) Appl. No.: 16/867,849

(22) Filed: May 6, 2020

(65) Prior Publication Data

US 2021/0027946 A1 Jan. 28, 2021

(30) Foreign Application Priority Data

Jul. 25, 2019 (KR) .......................... 10-2019-0090176

(51) Int. Cl.
*H01G 4/248* (2006.01)
*H01G 4/224* (2006.01)
(Continued)

(52) U.S. Cl.
CPC ............. *H01G 4/248* (2013.01); *H01G 4/224* (2013.01); *H01G 4/2325* (2013.01); *H01G 4/30* (2013.01);
(Continued)

(58) Field of Classification Search
CPC ...... H01G 4/248; H01G 4/224; H01G 4/2325; H01G 4/30; H01G 4/38; H01G 4/012;
(Continued)

(56) References Cited

U.S. PATENT DOCUMENTS

| 2006/0110538 A1* | 5/2006 | Yokoi | ...................... H01G 9/08 |
| | | | 427/306 |
| 2007/0081301 A1* | 4/2007 | Tanaka | ...................... H01G 9/15 |
| | | | 361/540 |

(Continued)

FOREIGN PATENT DOCUMENTS

JP 5664574 B2 12/2014
JP 2019-9359 A 1/2019

*Primary Examiner* — Michael P McFadden
(74) *Attorney, Agent, or Firm* — Morgan, Lewis & Bockius LLP

(57) ABSTRACT

An electronic component and a mounting substrate thereof provide metal frames that reduce stress transmission while occupying only a limited mounting area. The electronic component includes a body, and first and second external electrodes respectively disposed on opposite ends of the body. A first metal frame includes a first support portion bonded to the first external electrode and a first mounting portion extending from a lower end of the first support portion toward the second external electrode. A second metal frame includes a second support portion bonded to the second external electrode and a second mounting portion extending form a lower end of the second support portion away from the first external electrode.

24 Claims, 6 Drawing Sheets

(51) Int. Cl.
*H01G 4/30* (2006.01)
*H01G 4/232* (2006.01)
*H05K 1/18* (2006.01)
*H05K 1/11* (2006.01)

(52) U.S. Cl.
CPC ............ *H05K 1/111* (2013.01); *H05K 1/181* (2013.01); *H05K 2201/10015* (2013.01); *H05K 2201/10628* (2013.01); *H05K 2201/10757* (2013.01)

(58) Field of Classification Search
CPC .... H01G 4/1227; H01G 4/1245; H01G 4/065; H01G 4/0085; H01G 4/40; H01G 4/12; H05K 1/111; H05K 1/181; H05K 2201/10015; H05K 2201/10628; H05K 2201/10757; H05K 1/0231
See application file for complete search history.

(56) References Cited

U.S. PATENT DOCUMENTS

| | | |
|---|---|---|
| 2012/0236462 A1 | 9/2012 | Haruki et al. |
| 2016/0086730 A1* | 3/2016 | Park .................. H01G 4/30 174/260 |
| 2016/0217928 A1* | 7/2016 | Park .................. H01G 2/06 |
| 2017/0358397 A1* | 12/2017 | McConnell .......... H01G 4/2325 |
| 2018/0374639 A1 | 12/2018 | Akiyoshi |

* cited by examiner

ELECTRONIC COMPONENT AND SUBSTRATE HAVING THE SAME MOUNTED THEREON

CROSS-REFERENCE TO RELATED APPLICATION(S)

This application claims benefit of priority to Korean Patent Application No. 10-2019-0090176 filed on Jul. 25, 2019 in the Korean Intellectual Property Office, the disclosure of which is incorporated herein by reference in its entirety.

BACKGROUND

1. Field

The present disclosure relates to an electronic component and a mounting substrate thereof.

2. Description of Related Art

A multilayer capacitor is used in various electronic devices since such a capacitor is small in size and high in capacity.

Recently, as a result of a rapid rise of eco-friendly vehicles and electric vehicles, power driving systems in automobiles are increasing and demand for multilayer capacitors required for automobiles is also increasing.

In order to be used in automotive parts, high levels of thermal reliability, electrical reliability, and mechanical reliability are required, and thus the performance required for multilayer capacitors is being gradually advanced.

Accordingly, there is demand for a structure of a multilayer capacitor having high resistance to vibrations and deformation.

In order to improve resistance to such vibrations and deformation, an electronic component having a structure in which a multilayer capacitor is mounted to be spaced apart from a substrate by a predetermined interval using a metal frame is disclosed.

However, in the case of an electronic component using a conventional metal frame, there is a problem that mounting density in a limited space is low, and an insulating distance of left and right metal frames may not be sufficiently secured, and insulating properties may be deteriorated.

SUMMARY

An aspect of the present disclosure is to provide an electronic component and a mounting substrate thereof in which mounting density in a limited space is increased, and in which an insulating distance between left and right metal frames is sufficient to maintain insulating properties in a multilayer capacitor using a metal frame.

According to an aspect of the present disclosure, an electronic component includes a body and first and second external electrodes disposed on opposite ends of the body in a first direction. A first metal frame includes a first support portion bonded to the first external electrode and a first mounting portion extending from a lower end of the first support portion parallel to the first direction and toward the second external electrode. A second metal frame includes a second support portion bonded to the second external electrode and a second mounting portion extending from a lower end of the second support portion parallel to the first direction and away from the first external electrode.

In an embodiment of the present disclosure, when a shortest distance between the first and second external electrodes is defined as d1 and a shortest distance between the first and second mounting portions is defined as d2, d1<d2 may be satisfied.

In an embodiment of the present disclosure, the body may include a first internal electrodes and second internal electrodes alternately disposed with dielectric layers interposed therebetween, the first and second internal electrodes each being exposed through a respective one of the opposite ends of the body in the first direction such that one end of each of the first and second internal electrodes is connected to a respective one of the first and second external electrodes.

In an embodiment of the present disclosure, the first and second external electrodes may include respective first and second head portions respectively disposed on the opposite ends of the body in the first direction, and respective first and second band portions respectively extending from the first and second head portions to portions of upper and lower surfaces of the body and portions of opposing side surfaces of the body.

In an embodiment of the present disclosure, in the first and second metal frames, the first and second support portions may be bonded to the first and second head portions of the first and second external electrodes, respectively, and the first and second mounting portions may be spaced apart from the body and from the first and second band portions.

In an embodiment of the present disclosure, a first conductive bonding layer may be disposed between the first external electrode and the first support portion and a second conductive bonding layer maybe disposed between the second external electrode and the second support portion.

In an embodiment of the present disclosure, first and second plating layers may be disposed on surfaces of the first and second external electrodes, respectively. The first and second plating layers may include first and second nickel plating layers respectively covering the first and second external electrodes and first and second tin plating layers respectively covering the first and second nickel plating layers.

According to another aspect of the present disclosure, a mounting substrate of an electronic component includes the electronic component and a substrate having first and second land patterns disposed to be spaced apart from each other on an upper surface thereof. The electronic component is mounted to the substrate such that the first and second mounting portions of the first and second metal frames are connected to the first and second land patterns of the substrate, respectively.

According to another aspect of the present disclosure, an electronic component includes a body and first and second external electrodes respectively disposed on first and second opposite ends of the body. A first metal frame includes a first support portion disposed on the first external electrode and a first mounting portion extending from an end of the first support portion. A second metal frame includes a second support portion disposed on the second external electrode and a second mounting portion extending from an end of the second support portion. A shortest distance d2 between the first and second mounting portions is larger than a shortest distance d1 between the first and second external electrodes, and is shorter than a distance between the first and second opposite ends of the body.

According to a further aspect of the present disclosure, an electronic component includes a body and first and second external electrodes respectively disposed on first and second opposite ends of the body. A first metal frame is connected to the first external electrode and has a first mounting portion that is overlayed by the body along a first direction parallel to the first end of the body. A second metal frame is connected to the second external electrode and has a second mounting portion that is outside of an area of overlap with the body along the first direction parallel to the first end of the body.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
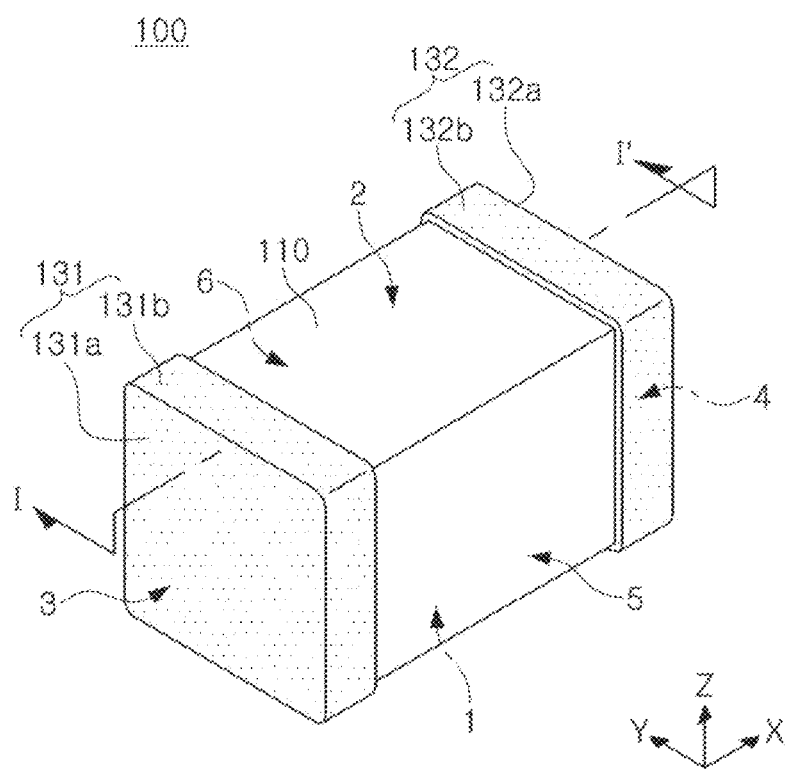
FIG. 1 is a schematic perspective view illustrating a multilayer capacitor in accordance with an embodiment of the present inventive concept.

Hereinafter, exemplary embodiments of the present disclosure will be described in detail with reference to the accompanying drawings.

The present disclosure may, however, be exemplified in many different forms and should not be construed as being limited to the specific embodiments set forth herein.

Rather, these embodiments are provided so that this disclosure will be thorough and complete, and will fully convey the scope of the disclosure to those skilled in the art.

In the drawings, the shapes and dimensions of elements may be exaggerated for clarity. Further, in the drawings, elements having the same functions within the same scope of the inventive concept will be designated by the same reference numerals.

In addition, the same reference numerals are used throughout the drawings for portions having similar functions and operations.

Throughout the specification, when a component is referred to as "comprise" or "comprising," it means that it may include other components as well, rather than excluding other components, unless specifically stated otherwise.

When a direction is defined to clearly explain an embodiment of the present disclosure, X, Y, and Z shown in figures respectively represent a length direction, a width direction, and a thickness direction of the multilayer capacitor and the electronic component.

Here, the Z direction may be conceptually the same as a lamination direction or stacking direction in which a dielectric layers are laminated or stacked.

Figure 2A:
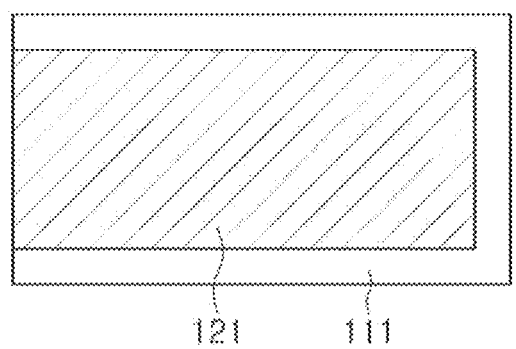
FIGS. 2A and 2B are plan views illustrating first and second internal electrodes of the multilayer capacitor of FIG. 1.
Figure 2B:
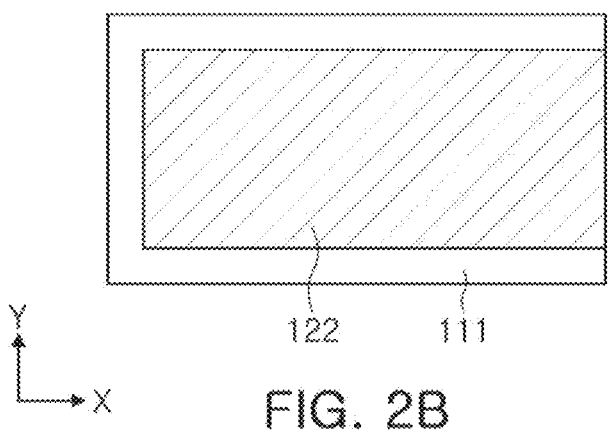
Figure 3:
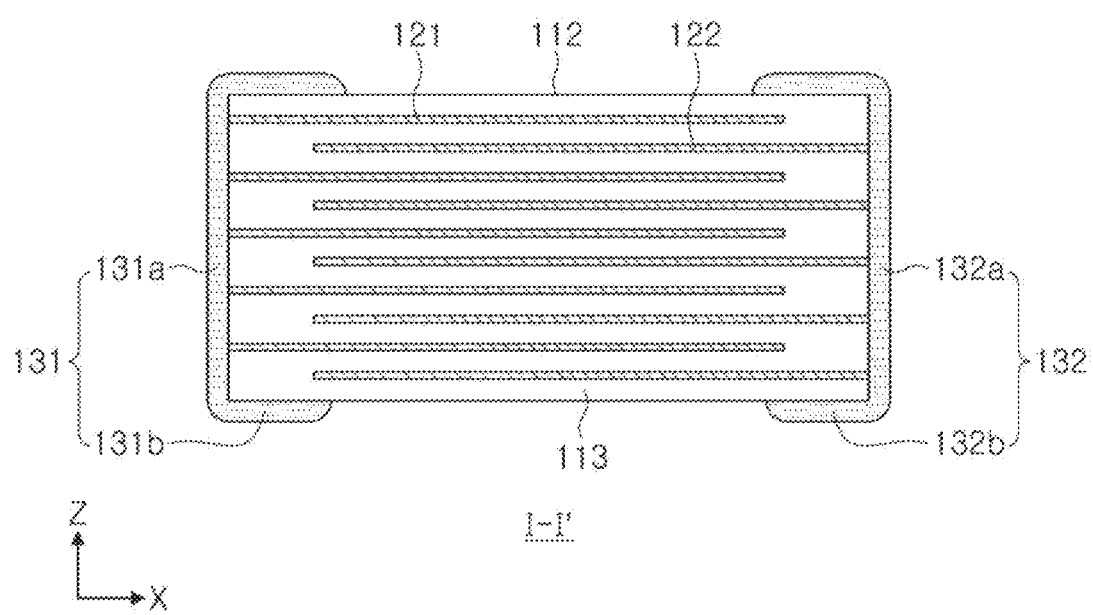
FIG. 3 is a cross-sectional view taken along line I-I' of FIG. 1.

FIG. 1 is a schematic perspective view illustrating a multilayer capacitor applied to an embodiment of the present disclosure, and FIGS. 2A and 2B are plan views illustrating first and second internal electrodes, respectively, applied to the multilayer capacitor of FIG. 1, and FIG. 3 is a cross-sectional view taken along line I-I' of FIG. 1.

First, a structure of a multilayer capacitor 100 applied to an electronic component of the present embodiment will be described with reference to FIGS. 1, 2A, 2B, and 3.

Referring to FIGS. 1, 2A, 2B, and 3, the multilayer capacitor 100 of the present embodiment includes a body 110 having first and second external electrodes 131 and 132 formed on opposite ends of the body 110 in the X direction defined as a first direction.

The body 110 is formed by laminating a plurality of dielectric layers 111 in the Z direction and then sintering the plurality of dielectric layers 111, and boundaries between the dielectric layers 111 adjacent to each other may be integrated, such that they may be difficult to confirm without using a scanning electron microscope (SEM).

In addition, the body 110 may include the plurality of dielectric layers 111, and first and second internal electrodes 121 and 122 having different polarities from each other alternately disposed in the Z direction with the dielectric layers 111 interposed therebetween.

In addition, the body 110 may include an active region serving as a part contributing to capacitance formation of the capacitor and over regions 112 and 113 provided in upper and lower portions of the active region in the Z direction, respectively, as margin portions. The cover regions 112 and 113 may respectively be provided above an uppermost internal electrode and below a lowermost internal electrode in the body 110.

Although the shape of the body 110 is not particularly limited, it may be a hexahedron shape. The body 110 may have first and second surfaces 1 and 2 opposing each other in the z direction, third and fourth surfaces 3 and 4 connected to the first and second surfaces 1 and 2 and opposing each other in the x direction, and fifth and sixth surfaces 5 and 6 connected to the first and second surfaces 1 and 2 and connected to the third and fourth surfaces 3 and 4 and opposing each other in the Y direction.

The dielectric layers 111 may include ceramic powder, for example, $BaTiO_3$-based ceramic powder, or the like.

The $BaTiO_3$-based ceramic powder may be, for example, $(Ba_{1-x}Ca_x) TiO_3$, $Ba (Ti_{1-y}Ca_y)O_3$, $(Ba_{1-x}Ca_x) (Ti_{1-y}Zr_y)O_3$, $Ba (Ti_{1-y}Zr_y)O_3$, or the like, in which Ca, Zr, or the like is partially dissolved in $BaTiO_3$, and the present disclosure is not limited thereto.

In addition, a ceramic additive, an organic solvent, a plasticizer, a binder, a dispersant, and the like, may further be added to the dielectric layers 111, together with the ceramic powder.

The ceramic additive, may be, for example, a transition metal oxide or a transition metal carbide, a rare earth element, magnesium (Mg), aluminum (Al), or the like.

The first and second internal electrodes 121 and 122 are electrodes to which different polarities are applied, and may be formed on the dielectric layer 111 and laminated in the Z direction. The first and second internal electrodes 121 and 122 may be alternately disposed in the body 110 to oppose each other with the dielectric layers 111 interposed therebetween in the Z direction.

In this case, the first and second internal electrodes 121 and 122 may be electrically insulated from each other by the dielectric layers 111 disposed in a middle position.

Meanwhile, in the present disclosure, a structure in which the internal electrodes are laminated in the Z direction has been described, but the present disclosure is not limited thereto, and a structure in which the internal electrodes are laminated in the Y direction, may also be applied thereto, if appropriate.

One end of each of the first internal electrodes 121 may be exposed through the third surface 3, and one end of each of the second internal electrodes 122 may be exposed through the fourth surface 4 of the body 110.

The end portions of the first and second internal electrodes 121 and 122 respectively exposed through the third and fourth surfaces 3 and 4 of the body 110 maybe respectively connected (e.g., electrically connected) to the first and second external electrodes 131 and 132 disposed at opposite ends the body 110 in the X direction to be described later.

According to the above-described configuration, when a predetermined voltage is applied to the first and second external electrodes 131 and 132, charges are accumulated between the first and second internal electrodes 121 and 122.

In this case, capacitance of the multilayer capacitor 100 is proportional to an area of overlapped regions of the internal electrodes 121 and 122 superimposed over each other in the Z direction in the active region.

In addition, a material for forming the first and second internal electrodes 121 and 122 is not particularly limited, and maybe formed by using a noble metal material, or a conductive paste formed of at least one or more materials of nickel (Ni) or copper (Cu).

In this case, the conductive paste may be printed by using a screen printing method, a gravure printing method, or the like, but the present disclosure is not limited thereto.

The first and second external electrodes 131 and 132, which may be provided with voltages having different polarities, are disposed on opposite ends of the body 110 in the X direction, and may respectively be connected to the exposed end portions of the first and second internal electrodes 121 and 122 and may be electrically connected.

The first external electrode 131 may include a first head portion 131a and a first band portion 131b.

The first head portion 131a may be disposed on the third surface 3 of the body 110, may be in contact with an end portion exposed externally through the third surface 3 of the body 110 from each of the first internal electrode(s) 121, and may serve to physically and electrically connect the first internal electrode(s) 121 and the first external electrode 131 to each other.

The first band portion 131b may be a portion extending from the first head portion 131a to portions of the first, second, fifth, and sixth surfaces of the body 110, for improving fixing strength, or the like.

The second external electrode 132 may include a second head portion 132a and a second band portion 132b.

The second head portion 132a may be disposed on the fourth surface 4 of the body 110, may be in contact with an end portion exposed externally through the fourth surface 4 of the body 110 from each of the second external electrode(s) 122, and may serve to physicallyandelectricallyconnectthesecondinternalelectrode(s) 122 and the second external electrode 132 to each other.

The second band portion 132b is a portion extending from the second head portion 132a to portions of the first, second, fifth, and sixth surfaces 1, 2, 5, and 6 of the body 110 to improve fixing strength, and the like.

In the present embodiment, the first and second external electrodes 131 and 132 are made of a sintered electrode including at least one or more metal components selected from copper (Cu), nickel (Ni), and the like, and do not include precious metals.

In addition, the first and second external electrodes 131 and 132 may be made of a sintered metal including copper, and respective first and second plating layers may be further formed on a surface thereof.

In addition, the first and second plating layers may include first and second nickel plating layers covering the surfaces of the first and second external electrodes 131 and 132, respectively, and first and second tin (Sn) plating layers covering the first and second nickel plating layers, respectively.

Figure 4:
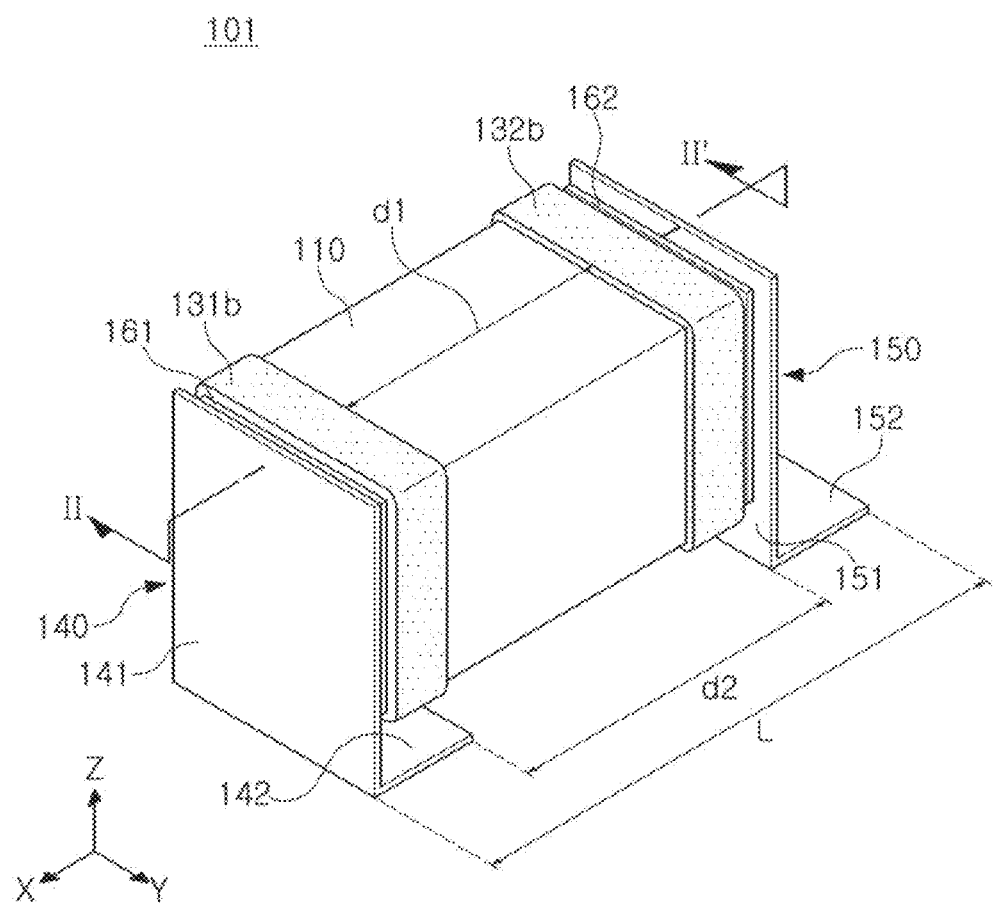
FIG. 4 is a schematic perspective view illustrating a metal frame bonded to the multilayer capacitor of FIG. 1.
Figure 5:
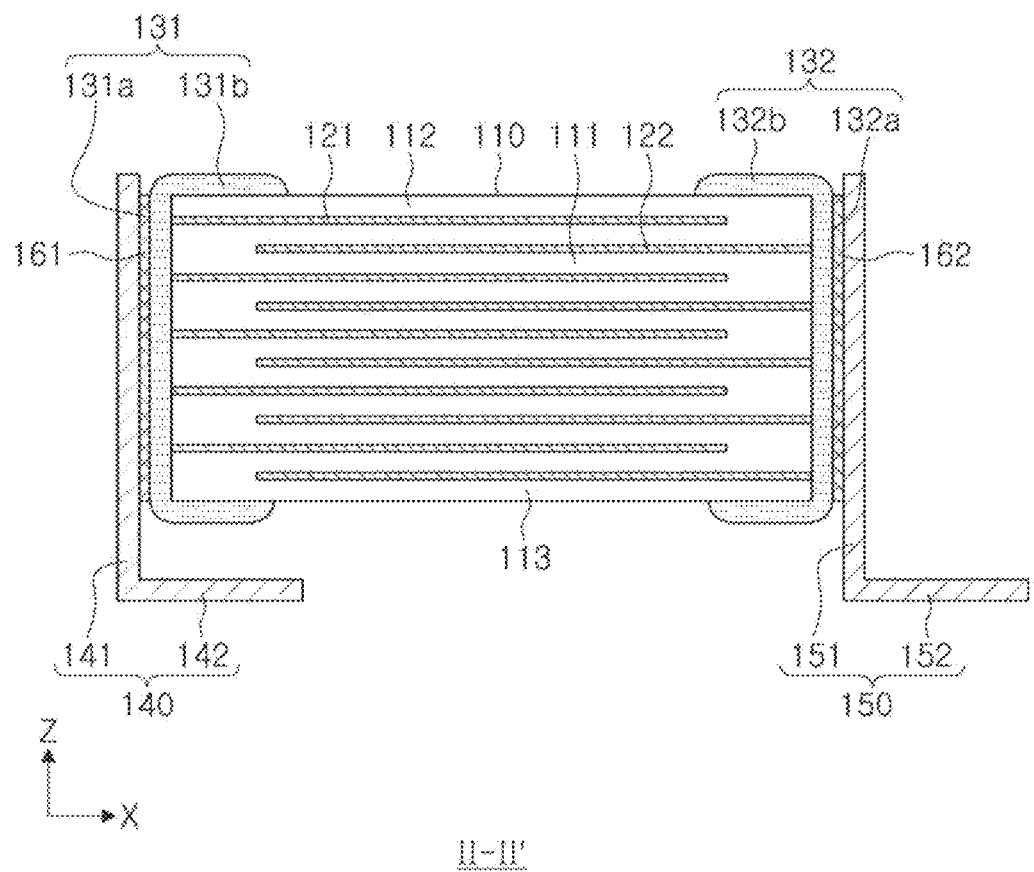
FIG. 5 is a cross-sectional view taken along line II-II' of FIG. 4.

FIG. 4 is a schematic perspective view illustrating that a metal frame is bonded to the multilayer capacitor of FIG. 1, and FIG. 5 is a cross-sectional view taken along line II-II' of FIG. 4.

Referring to FIGS. 4 and 5, an electronic component 101 of the present embodiment includes a multilayer capacitor 100 and first and second metal frames 140 and 150 respectively connected to the first and second external electrodes 131 and 132 of the multilayer capacitor 100.

The first metal frame 140 includes a first support portion 141 and a first mounting portion 142.

The first support portion 141 is a portion perpendicular to a mounting surface, and is bonded to the first head portion 131a of the first external electrode 131, and the first support portion 141 is electrically and physically connected to the first head portion 131a of the first external electrode 131.

The first mounting portion 142 is a portion extending in the X direction, which is the first direction parallel to the mounting surface, from a lower end of the first support portion 141 and is formed parallel to the mounting surface. The first mounting portion 142 serves as a connection terminal when mounting on a substrate.

In this case, the first mounting portion 142 extends from the first support portion 141 toward the second external electrode 132 in the X direction. In this way, the first mounting portion 142 extends in the X direction to be disposed underneath the body 110, such that the first mounting portion 142 is overlayed or overlapped by the body 110 along the Z direction.

In addition, the first mounting portion 142 is disposed to be spaced apart from the lower surface of the multilayer capacitor 100 in the Z direction by a predetermined distance.

That is, the first mounting portion 142 is disposed to be spaced apart from the first surface 1 of the body 110 and the lower first and second band portions 131b and 132b of the multilayer capacitor 100 in a Z direction by a predetermined distance.

The second metal frame 150 includes a second support portion 151 and a second mounting portion 152.

The second support portion 151 is a portion perpendicular to a mounting surface, and is bonded to the second head portion 132a of the second external electrode 132, and the second support portion 151 is electrically and physically connected to the second head portion 132a of the second external electrode 132.

The second mounting portion 152 is a portion that extends in the X direction, which is the first direction, from a lower end of the second support portion 151 and is formed parallel to the mounting surface. The second mounting portion 152 serves as a connection terminal when mounting on a substrate.

In this case, the second mounting portion 152 extends from the second support portion 151 in the same direction as the first mounting portion 142 extends from the first support portion 141 in the X direction. As such, the second mounting portion 152 extends away from the first and second external electrodes 131 and 132, and away from the body 110. In this way, the second mounting portion 152 extends in the X direction to be disposed outside of an area of overlap with the body 110 along the Z direction.

In addition, the second mounting portion 152 is disposed to be spaced apart from the lower surface of the multilayer capacitor 100 in the Z direction by a predetermined distance.

That is, the second mounting portion 152 is disposed to be spaced apart from the first surface 1 of the body 110 and the lower first and second band portions 131b and 132b of the multilayer capacitor 100 in the Z direction by a predetermined distance.

A first conductive bonding layer 161 may be disposed between the first external electrode 131 and the first support portion 141, and a second conductive bonding layer 162 may be disposed between the second external electrode 132 and the second support portion 151.

The first conductive bonding layer 161 may be disposed between the first head portion 131a of the first external electrode 131 and the first support portion 141 of the first metal frame 140.

In addition, the first conductive bonding layer 161 may be formed by including the same metal component as the metal component of the first head portion 131a of the first external electrode 131 as a main component.

The second conductive bonding layer 162 may be disposed between a second head portion 132a of the second external electrode 132 and the second support portion 151 of the second metal frame 150.

In addition, the second conductive bonding layer 162 may be formed using the same metal component as the metal component of the second head portion 132a of the second external electrode 132 as a main component.

Figure 6:
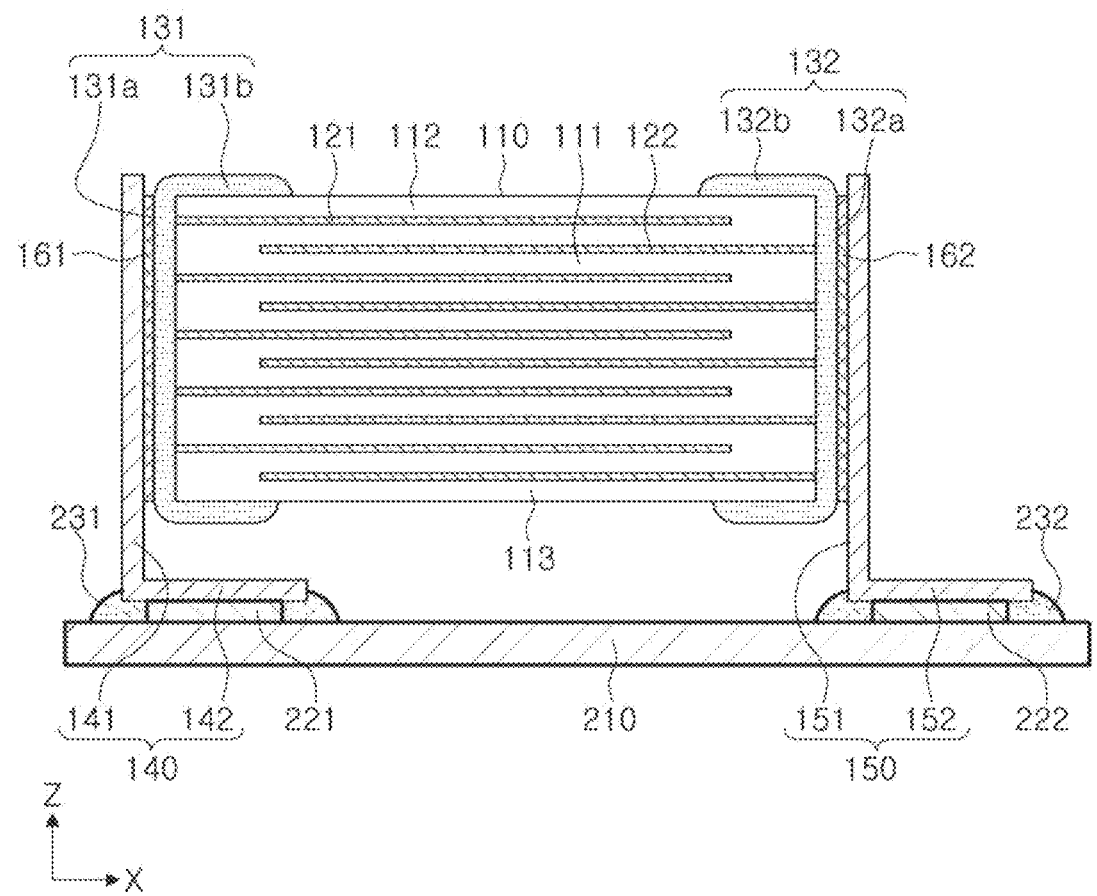
FIG. 6 is a schematic cross-sectional view illustrating an electronic component according to an example embodiment of the present inventive concept mounted on a substrate.

FIG. 6 is a schematic cross-sectional view illustrating an electronic component according to an embodiment of the present disclosure mounted on a substrate.

Referring to FIG. 6, a mounting substrate according to the present embodiment includes a substrate 210, first and second land patterns 221 and 222 disposed to be spaced apart from each other on the upper surface of the substrate 210.

In this case, the electronic component 100 is connected in a state in which the first and second mounting portions 142 and 152 of the first and second metal frames 140 and 150 are located to be in contact above the first and second land patterns 221 and 222, respectively. The electronic component 100 is thereby mounted on the substrate 210, and may be electrically and physically connected thereto by solders 231 and 232.

In the conventional multilayer capacitor, the capacitor body and the substrate are in direct contact with each other by the solder when mounting the substrate, and heat or mechanical deformation generated from the substrate is directly transferred to the multilayer capacitor, thereby making it difficult to secure a high level of reliability.

However, in the present embodiment, the first and second metal frames are bonded on opposite end surfaces of the multilayer capacitor in the X direction to secure a gap between the multilayer capacitor and the mounting substrate, thereby preventing stress from the substrate from being directly transmitted to the multilayer capacitor, thereby improving reliability.

In addition, an electronic component having a structure in which the conventional metal frame is bonded is formed such that an area of the mounting portion of the metal frame (e.g., an area of length L in FIG. 4) is wider than that of the external electrode of the general multilayer capacitor in order for the electronic component to support the above multilayer capacitor and to be stably mounted on the substrate.

However, when the area of the mounting portion of the metal frame is increased, a distance between both terminals, that is, a creepage distance for insulation, is reduced, which may cause problems in high voltage applications such as for automobiles.

In order to secure a creepage distance of the electronic component bonded to the metal frame, a method of reducing the area of the mounting portion of the metal frame is disclosed.

However, in this case, the first and second mounting portions of the first and second metal frames are opposite to each other and extend both inwardly of the capacitor body (e.g., underneath the capacitor body), such that an insulation distance d2 between both ends of the first and second mounting portions may be inevitably smaller than an insulation distance d1 between the first and second external electrodes of the multilayer capacitor.

Therefore, mounting adhesion of the multilayer capacitor may be reduced and a risk that the electronic component mounted on the substrate may be conducted may be increased.

In addition, in another conventional technique, both the first and second mounting portions of the first and second metal frames extend in an outward direction of the capacitor body to secure the creepage distance.

However, in this case, although an insulation distance between both ends of the first and second mounting portions is greater than an insulation distance between the first and second external electrodes of the multilayer capacitor, since a total length of the electronic component is increased by the sum of the length of the mounting portion of the extended metal frame, an area for mounting may be also greatly increased.

According to an embodiment of the present disclosure, the first and second mounting portions 142 and 152 of the first and second metal frames 140 and 150 may extend in the same direction, as shown in FIGS. 4-6.

In this case, when a shortest distance between the first and second external electrodes 131 and 132 is defined as d1, and a shortest distance between the first and second mounting portions 142 and 152 is defined as d2, d1<d2 may be satisfied. Moreover, the distance d2 may be smaller or shorter than a length of the capacitor 100 measured between opposing surfaces 3, 4 having the external electrodes thereon.

Accordingly, an insulation distance between the metal frames on both sides may be further secured than in a case in which the first and second mounting portions 142 and 152 simultaneously extend inwardly of the body 110 of the multilayer capacitor 100, and a mounting area may be further reduced to increase the mounting density in a limited space than in a case in which the first and second mounting portions 142 and 152 simultaneously extend outwardly of the body 110.

As set forth above, according to an embodiment of the present disclosure, the first and second mounting portions of the first and second metal frames are formed to extend in the same direction, such that an insulation distance may be further secured compared to a structure in which both the first and second mounting portions extend inwardly of the body, and a mounting area may be reduced compared to a structure in which both the first and second mounting portions extend outwardly of the body.

While exemplary embodiments have been shown and described above, it will be apparent to those skilled in the art that modifications and variations could be made without departing from the scope of the present invention as defined by the appended claims.

What is claimed is:

1. An electronic component, comprising:
   a body;
   first and second external electrodes respectively disposed on opposite ends of the body in a first direction;
   a first metal frame including a first support portion bonded to the first external electrode and a first mounting portion extending from a lower end of the first support portion parallel to the first direction and to an end of the first mounting portion toward the second external electrode; and
   a second metal frame including a second support portion bonded to the second external electrode and a second mounting portion extending from a lower end of the second support portion parallel to the first direction and away from the first external electrode.

2. The electronic component of claim 1, wherein d1<d2 is satisfied in which d1 is a shortest distance between the first and second external electrodes, and d2 is a shortest distance between the first and second mounting portions.

3. The electronic component of claim 1, wherein the body comprises first internal electrodes and second internal electrodes alternately disposed with dielectric layers interposed therebetween, the first and second internal electrodes each being exposed through a respective one of the opposite ends of the body in the first direction such that one end of each of the first and second internal electrodes is connected to a respective one of the first and second external electrodes.

4. The electronic component of claim 1, wherein the first and second external electrodes comprise respective first and second head portions respectively disposed on the opposite ends of the body in the first direction, and respective first and second band portions respectively extending from the first and second head portions to portions of upper and lower surfaces of the body and to portions of opposing side surfaces of the body.

5. The electronic component of claim 4, wherein the first and second metal frames are configured such that the first and second support portions are bonded to the first and second head portions of the first and second external electrodes, respectively, and
   the first and second mounting portions are spaced apart from the body and from the first and second band portions.

6. The electronic component of claim 1, further comprising a first conductive bonding layer disposed between the first external electrode and the first support portion and a second conductive bonding layer disposed between the second external electrode and the second support portion.

7. The electronic component of claim 1, further comprising first and second plating layers disposed on surfaces of the first and second external electrodes, respectively,
   wherein the first and second plating layers comprise first and second nickel plating layers respectively covering the first and second external electrodes, and first and second tin plating layers respectively covering the first and second nickel plating layers.

8. A mounting substrate comprising:
   the electronic component of claim 1; and
   a substrate having first and second land patterns disposed to be spaced apart from each other on an upper surface thereof,
   wherein the electronic component is mounted to the substrate such that the first and second mounting portions of the first and second metal frames are connected to the first and second land patterns of the substrate, respectively.

9. The mounting substrate of claim 8, wherein the electronic component satisfies d1<d2 in which d1 is a shortest distance between the first and second external electrodes and d2 is a shortest distance between the first and second mounting portions.

10. The mounting substrate of claim 8, wherein the body of the electronic component comprises first internal electrodes and second internal electrodes alternately disposed with dielectric layers interposed therebetween, the first and second internal electrodes each being exposed through a respective one of the opposite ends of the body in the first direction such that one end of each of the first and second internal electrodes is connected to a respective one of the first and second external electrodes.

11. The mounting substrate of claim 8, wherein the first and second external electrodes of the electronic component comprise respective first and second head portions respectively disposed on the opposite ends of the body in the first direction, and respective first and second band portions respectively extending from the first and second head portions to portions of upper and lower surfaces of the body and to portions of opposing side surfaces of the body.

12. The mounting substrate of claim 11, wherein the first and second support portions are bonded to the first and second head portions of the first and second external electrodes, respectively, and the first and second mounting portions are spaced apart from the body and from the first and second band portions.

13. The mounting substrate of claim 8, wherein the electronic component further comprises a first conductive bonding layer disposed between the first external electrode and the first support portion and a second conductive bonding layer disposed between the second external electrode and the second support portion.

14. The mounting substrate of claim 8, wherein the electronic component further comprises first and second plating layers formed on surfaces of the first and second external electrodes, respectively, and
   the first and second plating layers comprise first and second nickel plating layers respectively covering the first and second external electrodes, and first and second tin plating layers respectively covering the first and second nickel plating layers.

15. An electronic component, comprising:
   a body;
   first and second external electrodes respectively disposed on first and second opposite ends of the body in a first direction;
   a first metal frame including a first support portion disposed on the first external electrode and a first mounting portion extending from an end of the first support portion; and
   a second metal frame including a second support portion disposed on the second external electrode and a second mounting portion extending from an end of the second support portion,
   wherein a shortest distance d2 between the first and second mounting portions is larger than a shortest distance d1 between the first and second external electrodes, and is shorter than a distance between the first and second opposite ends of the body, and
   wherein the shortest distance d2 is defined by a first point overlapping the body in a second direction perpendicular to the first direction and a second point not overlapping the body in the second direction.

16. The electronic component of claim 15, wherein the first mounting portion extends orthogonally to the first support portion, and the second mounting portion extends orthogonally to the second support portion.

17. The electronic component of claim 15, wherein the first mounting portion extends orthogonally to the first end of the body and toward the second external electrode, and the second mounting portion extends orthogonally to the second end of the body and away from the first external electrode.

18. The electronic component of claim 15, wherein the first and second mounting portions are spaced apart from the body and the first and second external electrodes.

19. The electronic component of claim 15, wherein the first and second mounting portions are parallel to a surface of the body connecting the first and second opposite ends of the body.

20. The electronic component of claim 15, wherein the body comprises first internal electrodes and second internal electrodes that are alternately stacked with dielectric layers therebetween, wherein the first internal electrodes are connected to the first external electrode and the second internal electrodes are connected to the second external electrode.

21. An electronic component, comprising:
a body;
first and second external electrodes respectively disposed on first and second opposite surfaces of the body;
a first metal frame connected to the first external electrode and having a first mounting portion that is overlayed by the body along a first direction parallel to the first end of the body; and
a second metal frame connected to the second external electrode and having a second mounting portion that is outside of an area of overlap with the body along the first direction parallel to the first end of the body.

22. The electronic component of claim 21, wherein the first mounting portion extends orthogonally to the first direction and is spaced apart from the body and from the first and second external electrodes, and the second mounting portion extends orthogonally to the first direction and is spaced apart from the body and from the first and second external electrodes.

23. The electronic component of claim 22, wherein the first metal frame further includes a first support portion bonded to the first external electrode and having the first mounting portion extending from an end thereof, and the second metal frame further includes a second support portion bonded to the second external electrode and having the second mounting portion extending from an end thereof.

24. The electronic component of claim 21, wherein the body comprises first internal electrodes and second internal electrodes that are alternately stacked with dielectric layers therebetween, wherein the first internal electrodes are connected to the first external electrode and the second internal electrodes are connected to the second external electrode.

* * * * *